United States Patent
Henwood et al.

(10) Patent No.: US 12,360,144 B2
(45) Date of Patent: Jul. 15, 2025

(54) METHOD AND SYSTEM FOR MONITORING OPERATION STATUS OF AN ELECTRIC MOTOR IN REAL TIME

(71) Applicant: Schneider Toshiba Inverter Europe SAS, Pacy sur Eure (FR)

(72) Inventors: Nicolas Henwood, Carrières sous Poissy (FR); Matthias Machiels, La Saussaye (FR); Al Kassem Jebai, Vernon (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 140 days.

(21) Appl. No.: 18/082,835

(22) Filed: Dec. 16, 2022

(65) Prior Publication Data

US 2023/0204640 A1 Jun. 29, 2023

(30) Foreign Application Priority Data

Dec. 22, 2021 (EP) .................................... 21306906

(51) Int. Cl.
*G01R 23/16* (2006.01)
*G01R 31/34* (2020.01)
*H02P 23/14* (2006.01)

(52) U.S. Cl.
CPC ............ *G01R 23/16* (2013.01); *G01R 31/343* (2013.01); *H02P 23/14* (2013.01)

(58) Field of Classification Search
CPC ...... G01R 23/16; G01R 31/343; G01R 23/18; H02P 23/14; G06F 17/14
See application file for complete search history.

(56) References Cited

U.S. PATENT DOCUMENTS

| | | | |
|---|---|---|---|
| 5,461,329 A | 10/1995 | Linehan et al. | |
| 2006/0006879 A1* | 1/2006 | Mirafzal | G01R 31/343 324/545 |
| 2007/0260661 A1* | 11/2007 | Pelton | G06F 17/141 708/405 |
| 2017/0178421 A1* | 6/2017 | Worden | B61L 25/021 |
| 2018/0180652 A1 | 6/2018 | Sestok, IV et al. | |
| 2020/0132772 A1* | 4/2020 | Singh | H02J 3/241 |

FOREIGN PATENT DOCUMENTS

| | | |
|---|---|---|
| EP | 1291663 A1 | 3/2003 |
| EP | 1298511 A1 | 4/2003 |

OTHER PUBLICATIONS

Steven W. Smith, The Scientist and Engineer's Guide to Digital Signal Processing, Chapter 8, The Discrete Fourier Transform, pp. 141-168, available Apr. 19, 2021 online at https://web.archive.org/web/20210419124651/https://www.dspguide.com/CH8.PDF (Year: 2021).*

(Continued)

*Primary Examiner* — Daniel R Miller (74) *Attorney, Agent, or Firm* — Troutman Pepper Locke LLP (57) ABSTRACT

A method for monitoring operation status of an electric motor in real time, including: reading a drive application signal of the electric motor; selecting a frequency to be observed; analyzing the frequency to be observed to obtain a spectrum thereof; analyzing the spectrum; and detecting the operation status of the electric motor on the basis of the spectrum analysis.

17 Claims, 4 Drawing Sheets

(56) References Cited

OTHER PUBLICATIONS

P. Dobra et al., "Model based fault detection for electrical drives with BLDC motor," 2014 IEEE International Conference on Automation, Quality and Testing, Robotics, Cluj-Napoca, Romania, 2014, pp. 1-5 (Year: 2014).*

Anonymous, "Discrete Fourier transform—Wikipedia", Oct. 24, 2021, XP055939337, retrieved from the Internet on Jul. 6, 2022: URL: https://en.wikipedia.org/w/index.php?title=Discrete_Fourier_transform&oldid=1051586090, 14 pages.

European Search Report and Search Opinion dated Jul. 15, 2022 for corresponding European Patent Application No. EP21306906.5, 8 pages.

* cited by examiner

METHOD AND SYSTEM FOR MONITORING OPERATION STATUS OF AN ELECTRIC MOTOR IN REAL TIME

FIELD OF INVENTION

The present invention relates to the field of electrical equipment monitoring and diagnosis, especially to the field of monitoring operation status of an electric motor.

BACKGROUND

With the development of modern industry, more and more electric motors have been used in the manufacturing system. These motors are important transmission elements and executive elements of equipment in the system. Its nominal operation is of great significance to ensure the safe, high-efficiency, high-quality and low-consumption operation of the manufacturing process. An error or fault in the motor will not only damage the motor itself, but also affect the entire production. The error may even endanger safety of a person operating the motor.

Therefore, it is necessary to monitor the operation status of the electric motor, so as to reduce motor failure rate, maintenance costs, avoid dangers, to improve the stability of the system, and also to provide data for improving the performance or design of the electric motor.

In the art, it is common to use electric motor drive application signals to detect abnormal or special behavior. In particular, it is often to read the signals, such as internal drive specific features including, flux, stator frequency, estimated torque as well as external drive-specific features from bus voltage, currents, vibration sensor, position sensor, and then to store these signals for later post-processing and data analysis. The solution in the art can monitor and analyze the operation status of the electric motor. However, such a solution requires high memory and high processing power processor, and the results cannot be obtained in real time.

The present invention aims to improve these drawbacks, especially to effectively and timely monitor the operation status of an electric motor.

SUMMARY

In this regard, according to one aspect of the invention, it is provided a method for monitoring operation status of an electric motor in real time, the method comprising:
  reading a drive application signal of the electric motor, wherein the drive application signal can either be internal drive-specific features (e.g. flux, stator speed, estimated torque) as well as external (e.g. bus voltage, currents, vibration sensor, position sensor);
  selecting a frequency to be observed;
  analyzing the frequency to be observed to obtain a spectrum thereof, wherein a corresponding component of a spectrum is obtained to form the spectrum,
  Preferably, different frequencies can be selected and a spectrum of these frequencies is obtained;
  analyzing the spectrum; and
  detecting the operation status of the electric motor on the basis of the spectrum analysis, wherein the operation status may, for example, include vibration, electrical resonance, etc.

With such a method, it is possible to monitor the operation status of an electric motor in real time. In addition, the spectrum analysis on a wide frequency range can be done using parallel calculation for faster detection. Consequently, the detection time is strongly reduced compared to methods that store data and analyse them after. Moreover, the spectrum analysis can be also performed on different drive signals simultaneously for a more comprehensive monitoring.

In addition, since it is not necessary to store the signals for later post-processing and data analysis, only the computation results of the analyzed spectrum of the signals are stored for comparison and fault detection, if necessary. Therefore, there is no need for a high memory, neither high processing power processor, such as CPU.

Optionally, the step of analyzing the observed frequency to obtain a spectrum thereof is carried out by means of Fourier Transforms, especially by discrete Fourier Transforms (DFT). In particular, the step of analyzing the observed frequency to obtain a spectrum thereof may comprise obtaining discrete time Fourier Transforms component for the frequency of the drive application signal.

In an embodiment, obtaining the discrete Fourier Transforms (DFT) component comprises calculating the following integrators:

$$\mathrm{Re}X(f) = \frac{2}{N}\sum_{t=0}^{T}x(t) \times \sin^2\left(\frac{\pi t}{T}\right) \times \cos(2\pi f t)$$

$$\mathrm{Im}X(f) = \frac{-2}{N}\sum_{t=0}^{T}x(t) \times \sin^2\left(\frac{\pi t}{T}\right) \times (2\pi f t)$$

where x(t) is the input signal, T is an integration time, f is the frequency to be observed, wherein the integration time is inversely proportional to the corresponding frequency value and it, for example, varies from a few milliseconds to a few seconds, N is the number of iterations for the computation for the DFT component and is determined by the following formular:

$$N = \frac{T}{T_S} = \frac{k}{f \times T_S}$$

where k is a number of periods at the observed frequency, Ts is sample time;
and
calculating the following modulus $$|X_f| = 2 \times \sqrt{\mathrm{Re}X(f)^2 + \mathrm{Im}X(f)^2}$$

Optionally, discrete time Fourier Transforms can be run on different frequency ranges simultaneously or in sequence. Once the modulus is obtained, it is possible to compare the calculated modulus of the observed frequencies, so as to detect normal or abnormal operation status of the electric motor.

Preferably, in the abovementioned equations, $T_S=250$ μs, and other values can also be selected, as long as the observed frequency is lower than $$\frac{1}{2T_S}.$$

Preferably, in the abovementioned equations, T is in a range between 0.5 ms to 100 s, preferably 15 ms and 30 s.

Preferably, in the abovementioned equations, k is in a range between 1 and 100, preferably 30.

Preferably, in the abovementioned equations, the frequency f to be observed is in a range between 0.1 Hz and 2 kHz.

Optionally, the step of detecting the operation status of the electric motor on the basis of the spectrum analysis comprises:

comparing the analyzed spectrum with a normal spectrum, so as to detect an abnormal behavior of the electric motor, wherein the normal spectrum is precalculated or preset based on a properly operating motor.

Moreover, the method according to the present invention may further comprise:

displaying the operation status of the electric motor.

Preferably, when an abnormal operation status is detected, the method may further comprise warning a user of the issue, displaying recommendations, modifying motor parameters to mitigate risks, and/or shutting down the motor.

Optionally, according to the method of the present invention, only the analysed spectrum is stored in a memory, such as a RAM, and the drive application signals are discarded. Therefore, there is no need for a high memory, neither high processing power processor.

According to another aspect of the invention, it is also provided a computer program product comprising instructions to be executed by a processor, the instructions being adapted to performance of a method as mentioned above when executed by the processor.

According to a third aspect of the invention, it is further provided a system for monitoring operation status of an electric motor in real time, comprising:

at least one sensor for generating drive application signal of the electric motor;

optionally, a complex programmable logic device (CPLD), configured to decode the generated signal into digital signal, a digital signal processor (DSP), configured to execute the above-mentioned computer program based on the generated drive application signal (digital signal), to generate and analyze spectrum and detect the operation status of the electric motor; and optionally, a processor, such as CPU or ARM, configured to process the display of the analyzed spectrum.

In this regard, the present invention intends to catch the signal frequency signature in real time to detect the operation status of the electric motor, for monitoring, analyzing or diagnosing the electric motor, especially for the early detection of abnormal behavior and the prevention of damage to the motor, drive, or other components in the system, without additional hardware, as well as for monitoring tool for unexpected failures.

BRIEF DESCRIPTION OF THE DRAWINGS

Other features and advantages of the present invention will appear in the description hereinafter, in reference to the appended drawings, where.

DESCRIPTION OF EMBODIMENTS

Figure 1:
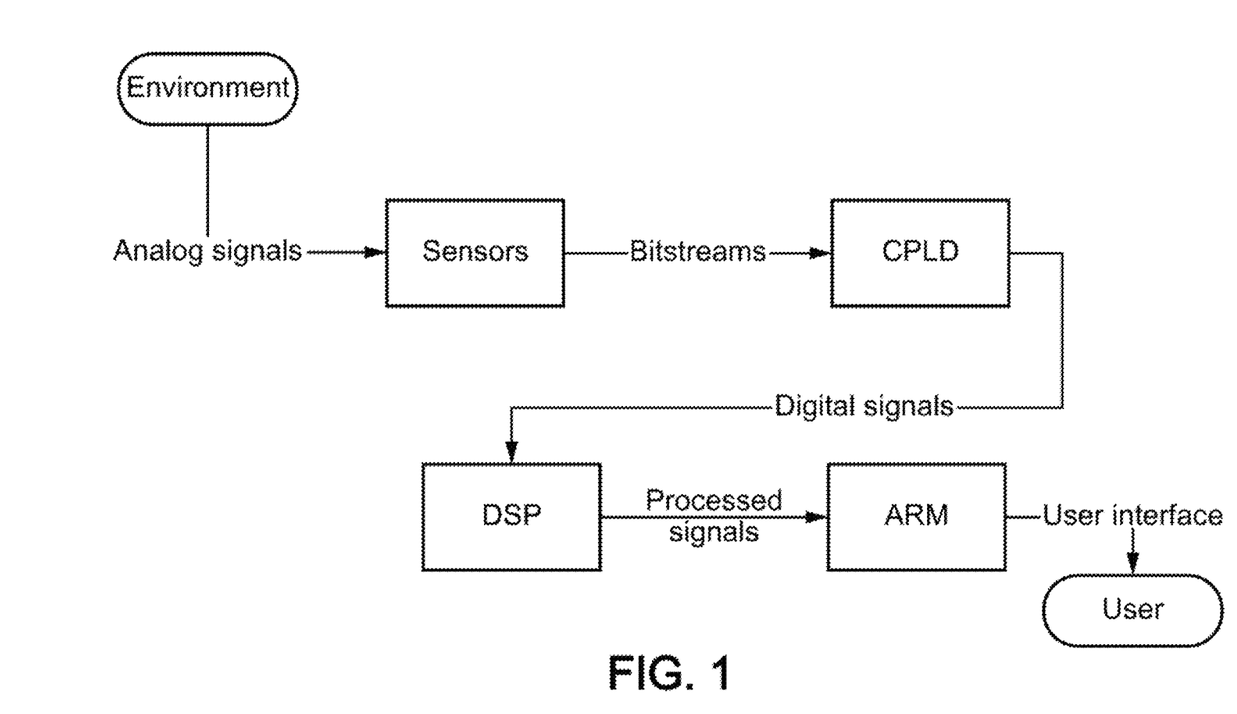
FIG. 1 illustrates a system for monitoring operation status of an electric motor in real time according to the present invention.

FIG. 1 shows a system for monitoring operation status of an electric motor in real time according to the invention. The system comprises the following components:

at least one sensor, wherein the sensor detects analog signals coming from the environment surrounding and relating to the electric motor, and the sensor generates drive application signal relating to the electric motor, wherein the sensor can be a current sensor, vibration sensor, position sensor, or other sensors known in the art;

preferably, a complex programmable logic device (CPLD), which decodes the bitstreams of the signals into digital signals.

a digital signal processor (DSP), which processes the digital signals to generate the spectrum according to the method of the present invention; and optionally, a processor, such as ARM, CPU, FPGA, configured to process the spectrum for display or for logging the same via a user interface to a user.

In one embodiment of the system according to the present invention, a F28M36x microcontroller can be used. It has 2 cores, i.e an ARM M3 core and a DSP C28 core. The algorithm according to the invention (along with the control law) runs on the C28 core.

Figure 2:
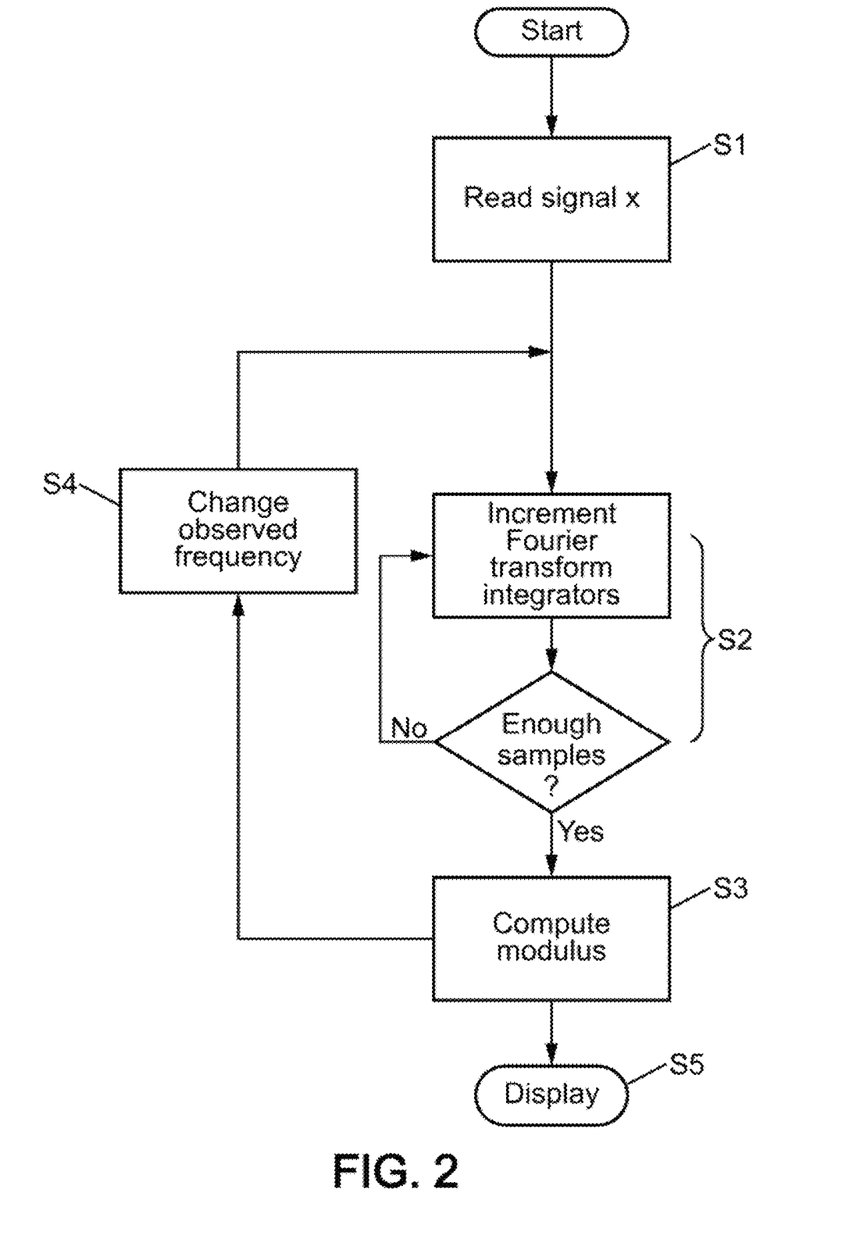
FIG. 2 illustrates a flowchart of an exemplary method for monitoring operation status of an electric motor in real time.

FIG. 2 shows a flowchart of an exemplary method for monitoring operation status of an electric motor in real time by means of the system in FIG. 1.

In step S1, signal X, such as bus voltage, flux, stator speed, estimated torque, and/or currents of the electric motor, is read, and a first frequency to be observed in the signal is selected, Then, in step S2, the observed frequency is analyzed so as to obtain its corresponding component of a spectrum and the spectrum thereof by means of Fourier Transform, especially by increment Fourier transform integrators, until a preset integration time T is reached, so as to obtain the component of discrete Fourier Transforms (DFT).

In Step S3, a modulus is calculated based on the obtained integrators of discrete Fourier Transforms (DFT).

In Step S4, a new frequency to be observed in the signal is selected, and steps S2 and S3 are repeated.

When all the frequencies to be observed in a frequency range, such as between 0 Hz to 2 kHz, are selected and their corresponding modulus are calculated wherein a spectrum is obtained and analyzed, a result is then output and displayed in Step S5.

Alternatively, in one exemplary implementation, the 0-2 kHz range can be split into several blocks, such as 6, and steps S2 to S4 can run in 6 parallel instances. Accordingly, the number of CPU cycles needed to increment the 12 integrators is 1675 per iteration. When one of the moduli is computed, 2000 cycles are required.

The spectrum analysis of the signal according to the present invention is further detailed in the below algorithm:

Let x be the signal we want to know the spectrum of.

Each DFT component is computed over a time T given as a number k of periods of the observed frequency f. The integrators are updated every sample time $T_S=250$ μs. The total number N of samples used is then:

$$N = \frac{T}{T_S} = \frac{k}{f \times T_S}$$

$T_S$: sampling time, time interval between consecutive iterations of the algorithm ($T_S$=0.25 ms in our implementation)

f: observed frequency, component of the DFT that is being computed, varies from 1 Hz to $$\frac{1}{2T_S}$$

(for example, from 1 to 2000 Hz)

k: number of periods used for the DFT computation, integer greater than 1 (for example, from 1 to 100, preferably k=30). If k is high, the accuracy of the computation is high, but it takes more time $$T = \frac{k}{f};$$

total duration of the computation for the component f of the DFT (for example, from 30 s to 15 ms)

$$N = \frac{T}{T_S};$$

total number of iterations needed for the computation for the component f of the DFT (for example, from 120 000 to 60)

$X_f$ is called the component at frequency f of the DFT of x. It is a complex number so we will only consider its module $|X_f|$. The module is computed through its real and imaginary parts ReX(f) and ImX(f).

Before the computation, a window is needed so that the computed components of the DFT do not interfere with each other. For instance, the window is a Hann window, which consists in multiplying the input signal x by a squared sine function of period T. However, other windows can also be used.

The algorithm then computes the component f of the DFT as follows:

$$\text{Re}X(f) = \frac{2}{N}\sum_{t=0}^{T}x(t) \times \sin^2\left(\frac{\pi t}{T}\right) \times \cos(2\pi ft)$$

$$\text{Im}X(f) = \frac{-2}{N}\sum_{t=0}^{T}x(t) \times \sin^2\left(\frac{\pi t}{T}\right) \times \sin(2\pi ft)$$

In the above equations, the term $\sin^2$ $$\left(\frac{\pi t}{T}\right)$$

is a windowing term, and the rest is the classic DFT.

After N samples, output the modulus:

$$|X| = 2 \times \sqrt{\text{Re}X(f)^2 + \text{Im}X(f)^2}$$

In the above equation, the factor "2" compensates the ½ factor introduced by the windowing term.

Then the algorithm stores or displays the value of $|X_f|$, it changes the value of f and runs again.

In one embodiment, the method according to the present invention can be used to detect a normal operation status of the electric motor, i.e. nominal operating conditions.

Figure 3:
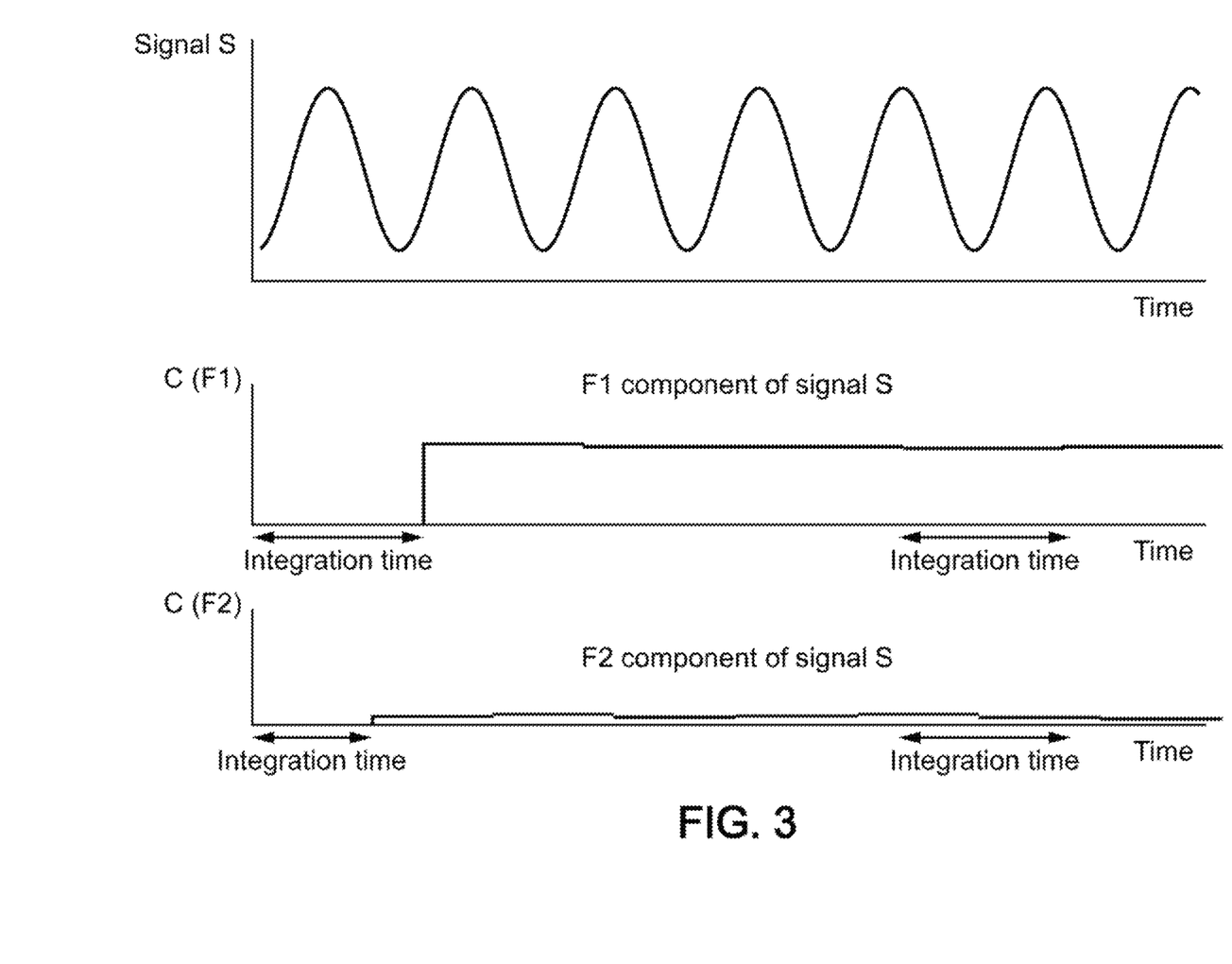
FIG. 3 illustrates a signal S of a motor under nominal operating conditions and two frequency components obtained by the method according to the present invention.

For a properly working electric motor, different frequencies of the spectrum are dispatched in several blocks, each block containing between 1 and M frequencies. The frequencies contained in a block are computed by the method according to the present invention one after the other. As an example, FIG. 3 shows the acquisition of two frequency components ($F_1$ and $F_2$, $F_2 > F_1$) for one signal S. Variations between two consecutive $C(F_1)$ and $C(F_2)$ values have been amplified to show the update rate. The integration time is inversely proportional to the corresponding frequency value, it varies from a few milliseconds to a few seconds.

In another embodiment, the method according to the present invention can be used to detect a fault of the electric motor.

Figure 4:
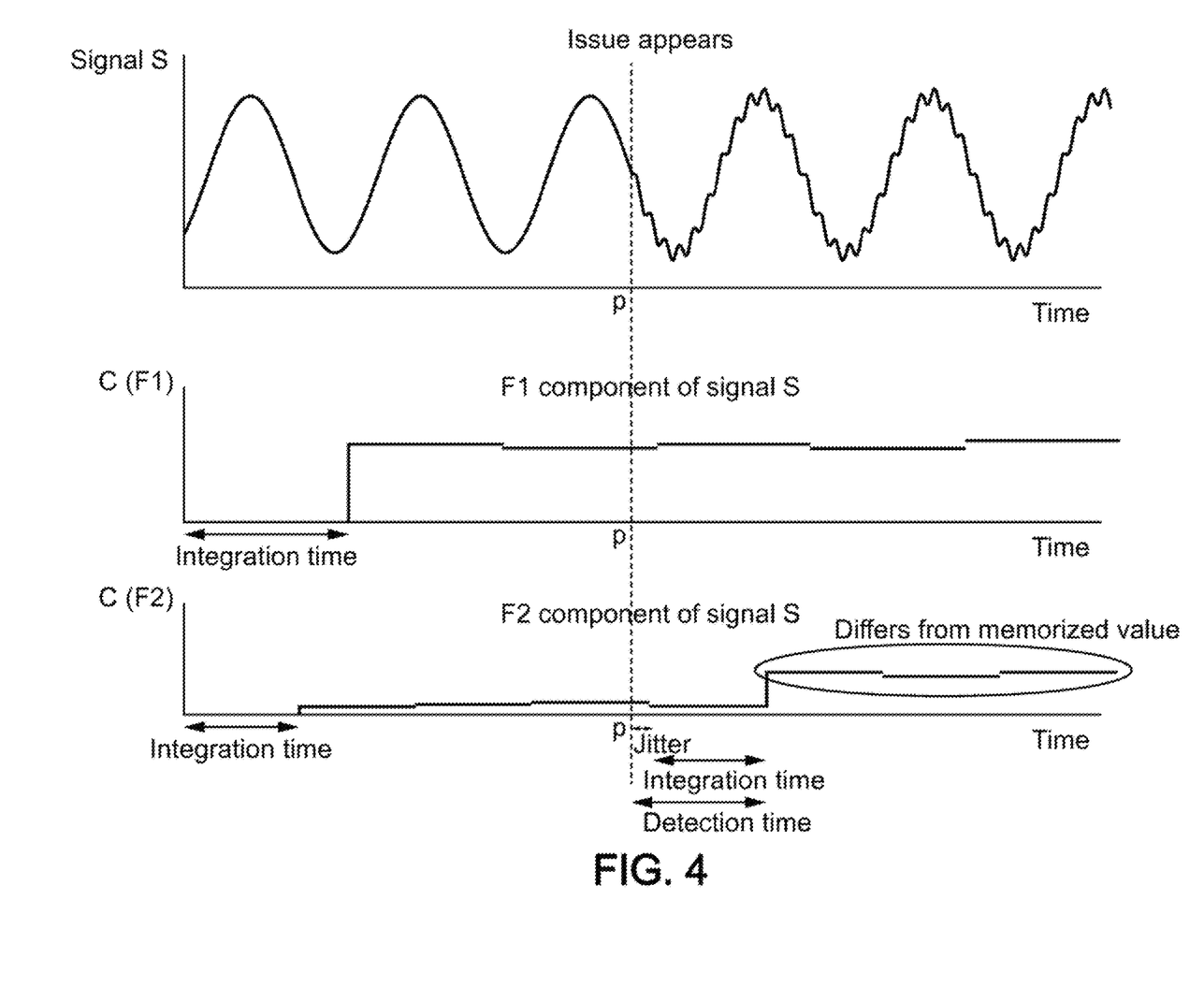
FIG. 4 illustrates a signal S of a motor with perturbation and two frequency components obtained by the method according to the present invention.

When a perturbation or an issue appears, the spectrum obtained by the present invention changes. The detection time is equal to the integration time plus a jitter shorter than the integration time. In this regard, the detection time is lower than twice the integration time. As shown in FIG. 4, for signal S, variations between two consecutive $C(F_1)$ and $C(F_2)$ values have been amplified to show the update rate. In FIG. 4, a perturbation or an issue appears in signal S at time p, and like in the embodiment of FIG. 3, two components $F_1$ and $F_2$ are analyzed. After a detection time (jitter plus integration time), the $F_1$ component does not change, whereas the $F_2$ component is different, i.e. higher than its nominal operating condition, i.e. a memorized nominal value. Therefore, a fault of the electric motor is detected.

It should be noted that in the method according to the invention, for example, during the comparison between components of normal and abnormal signals, measurement tolerance, computational tolerance, and/or system tolerance shall be considered.

After detecting the fault, several reactions are possible to take, for instance to warn the user of the fault, display recommendations, modify drive parameters to mitigate risks; and/or shut down the electric motor.

A further exemplary embodiment according to the present invention is discussed below to show how to monitor operation status of a motor running at 50 Hz and driving a pulley with a belt, especially to demonstrate how to detect the belt of the motor is tight or loose belt by means of present invention.

In this embodiment, the spectrum analysis covering 0 Hz to 2 kHz for squared voltages sum is acquired after 30 s using parallel computation based on the method of the present invention. In other words, the whole spectrum covering 0 Hz to 2 kHz is computed.

After the calculation according to the present invention, it is found that, among all the frequencies, the amplitude of the 100 Hz component of the spectrum of the squared voltages sum is different between a motor driving a pulley with a tight belt and a motor driving a pulley with a loose belt. The results are shown in table 1 below, wherein for the frequency with the same amplitude, only 50 Hz component, is shown, to avoid redundancy.

TABLE 1

| Sum of voltages squared spectrum components | | | |
|---|---|---|---|
| With tight belt | | With loose belt | |
| Frequency | Amplitude ($10^4$ $V^2$) | Frequency | Amplitude ($10^4$ $V^2$) |
| 50 Hz | 2 | 50 Hz | 2 |
| 100 Hz | 8 | 100 Hz | 14 |

Therefore, only the computation on the 50 Hz and 100 Hz component is now discussed as follows:

For 50 Hz component let s be the observed signal:

$$s(t)=v_1(t)^2+v_2(t)^2+v_3(t)^2$$

We can rewrite s as follows:

$$s(t)=A\times\cos(2\pi 50t)+B(t)$$

where A is the amplitude of the 50 Hz component of s, and B is the rest of the signal.

The algorithm computes the spectrum of s. Let's focus on the 50 Hz component. The integration time is chosen to be 30 periods long, so T=30/50=0.6 s. The integrators are calculated every 250 μs, so the total number of points is N=2400. With t incrementing by 250 μs at each step, we have:

$$\text{Re}(50\ \text{Hz}) = \frac{2}{2400}\sum_{t=0}^{0.6} s(t)\times\sin^2\left(\frac{\pi t}{0.6}\right)\times\cos(2\pi 50t)$$

$$\text{Im}(50\ \text{Hz}) = \frac{-2}{2400}\sum_{t=0}^{0.6} s(t)\times\sin^2\left(\frac{\pi t}{0.6}\right)\times\sin(2\pi 50t)$$

We replace s by its expression. After some trigonometry we obtain the following equations:

$$\text{Im}(50\ \text{Hz}) \approx 0$$

$$\text{Re}(50\ \text{Hz}) =$$

$$\frac{2}{2400}\sum_{t=0}^{0.6} A\times\cos^2(2\pi 50t)\times\sin^2\left(\frac{\pi t}{0.6}\right) + B(t)\times\sin^2\left(\frac{\pi t}{0.6}\right)\times\cos(2\pi 50t) =$$

$$C + \frac{2}{2400}\sum_{t=0}^{0.6}\left(\frac{A}{2}\times\cos^2(2\pi 50t)\times\left(1 - \cos\left(\frac{2\pi t}{0.6}\right)\right)\right)$$

Where C is the part $$B(t)\times\sin^2\left(\frac{\pi t}{0.6}\right)\times\cos(2\pi 50t).$$

C will be close to 0 since it does not contain the 50 Hz component. We will not focus on the imaginary part, it is easy to show that it is close to 0 but it takes a lot of trigonometry formulas. Mathematically it should be 0 but the algorithm works with integers, there are rounding errors.

$$\text{Re}(50\ \text{Hz}) \approx \frac{2}{2400}\sum_{t=0}^{0.6}\left(\frac{-A}{2}\times\cos^2(2\pi 50t)\times\cos\left(\frac{2\pi t}{0.6}\right) + \frac{A}{2}\times\cos^2(2\pi 50t)\right)$$

The sum of the term $$\frac{-A}{2}\times\cos^2(2\pi 50t)\times\cos\left(\frac{2\pi t}{0.6}\right)$$

will be close to 0 as well (which can be proven through trigonometry).

$$\text{Re}(50\ \text{Hz}) \approx \frac{2}{2400}\sum_{t=0}^{0.6}\frac{A}{4}\times(1 + \cos(4\pi 50t))$$

The sum of a cos( ) function over an integer number of periods is 0, so what remains is:

$$\text{Re}(50\ \text{Hz}) \approx \frac{2}{2400}\times\frac{A}{4}\times 2400 = \frac{A}{2}$$

The ½ factor comes from the windowing (the $\sin^2$ term). The modulus then becomes:

$$|S_{50\ Hz}|=2\times\sqrt{\text{Re}(50Hz)^2+\text{Im}(50Hz)^2}$$

$$|S_{50\ Hz}|=A$$

In the example above, we have A=2 with either the tight or loose belt.

For 100 Hz component

Similarly, let s be the observed signal:

$$s(t)=v_1(t)^2+v_2(t)^2+v_3(t)^2$$

We can rewrite s as follows:

$$s(t)=A\times\cos(2\pi 100t)+B(t)$$

where A is the amplitude of the 100 Hz component of s, and B is the rest of the signal.

The integration time is chosen to be 30 periods long, so T=30/100=0.3 s. The integrators are calculated every 250 μs, so the total number of points is N=1200. With t incrementing by 250 μs at each step, we have:

$$\text{Re}(100\ \text{Hz}) = \frac{2}{1200}\sum_{t=0}^{0.3} s(t)\times\sin^2\left(\frac{\pi t}{0.3}\right)\times\cos(2\pi 100t)$$

$$\text{Im}(100\ \text{Hz}) = \frac{-2}{1200}\sum_{t=0}^{0.3} s(t)\times\sin^2\left(\frac{\pi t}{0.3}\right)\times\sin(2\pi 100t)$$

After 0.3 s, the integration is complete. We can use the values of the real and imaginary part to compute the modulus of the 100 Hz component of the DFT:

$$A=2\times\sqrt{\text{Re}(100Hz)^2+\text{Im}(100Hz)^2}$$

In the example above, we have A=8 with the tight belt.

If the belt suddenly loses tension, the value of A will change. In the present embodiment, the value of A for 100 Hz changes to 14 for the motor with loose belt.

Furthermore, in the present embodiment, it may take at most 30 s to computer all the components. However, since T=0.3 s, the new value of A could be obtained after 0.3 second, meaning a real time monitoring is achieved.

Alternatively, another exemplary embodiment according to the present invention is to monitor and detect an unbalanced motor running at 50 Hz. In this embodiment, as an example, the current spectrum components of a motor (balanced or unbalanced) is analyzed, and it is found that among 25 Hz, 50 Hz and 300 Hz components, the 25 Hz component of the spectrum differs from the balanced motor one, as shown in Table 2 below.

TABLE 2

| Current spectrum components | | | |
|---|---|---|---|
| Balanced motor | | Unbalanced motor | |
| Frequency | Amplitude (A) | Frequency | Amplitude (A) |
| 25 Hz | 0 | 25 Hz | 0.5 |
| 50 Hz | 5 | 50 Hz | 5 |
| 300 Hz | 0.2 | 300 Hz | 0.2 |

Moreover, it is known to those skilled in the art, the aforementioned exemplary embodiments according to the present invention can be implemented in many ways, such as program instructions for execution by a processor, as software modules, microcode, as computer program product on computer readable media, as logic circuits, as application specific integrated circuits, as firmware, etc. The embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer, processing device, or any instruction execution system. For the purposes of this description, a computer-usable or computer readable medium can be any apparatus that can contain, store, communicate, or transport the program for use by or in connection with the instruction execution system, apparatus, or device. The medium can be electronic, magnetic, optical, or a semiconductor system (or apparatus or device). Examples of a computer-readable medium include, but are not limited to, a semiconductor or solid state memory, magnetic tape, a removable computer diskette, a RAM, a read-only memory (ROM), a rigid magnetic disk, an optical disk, etc. Current examples of optical disks include compact disk-read-only memory (CD-ROM), compact disk-read/write (CD-RAN) and DVD.

The embodiments described hereinabove are illustrations of this invention. Various modifications can be made to them without leaving the scope of the invention which stems from the annexed claims.

The invention claimed is:

1. A method for monitoring operation status of an electric motor in real time, comprising:
reading a drive application signal of the electric motor;
selecting a frequency of the signal to be observed;
analyzing the selected frequency of the signal to obtain a spectrum thereof;
analyzing the spectrum; and
detecting, within a detection time, an abnormal operation status of the electric motor on the basis of the spectrum analysis, wherein the detection time is equal to an integration time of the spectrum analysis plus a jitter, wherein the jitter is shorter than the integration time, and wherein the integration that is inversely proportional to the selected frequency.

2. The method according to claim 1, wherein the drive application signal comprises bus voltage, flux, stator speed, estimated torque, and/or currents of the electric motor.

3. The method according to claim 1, wherein analyzing the frequency to be observed comprises obtaining discrete Fourier Transforms (DFT) component for the frequency of the drive application signal.

4. The method according to claim 3, wherein obtaining the discrete Fourier Transforms (DFT) component comprises calculating the following integrators:

$$ReX(f) = \frac{2}{N}\sum_{t=0}^{T} x(t) \times \sin^2\left(\frac{\pi t}{T}\right) \times \cos(2\pi ft)$$

$$ImX(f) = \frac{-2}{N}\sum_{t=0}^{T} x(t) \times \sin^2\left(\frac{\pi t}{T}\right) \times \sin(2\pi ft)$$

where x[t] is the drive application signal, T is the integration time, f is the selected frequency, N is the number of iterations for the computation for the DFT component and is determined by the following formular:

$$N = \frac{T}{T_S} = \frac{k}{f \times T_S}$$

where k is a number of periods of the selected frequency, $T_S$ is a sample time;
and
calculating the following modulus $$|X| = 2 \times \sqrt{ReX(f)^2 + ImX(f)^2}.$$

5. The method according to claim 4, wherein $T_S = 250$ μs.

6. The method according to claim 4, wherein T is in a range between 0.5 ms and 100 s.

7. The method according to claim 4, wherein k is in a range between 1 and 100.

8. The method according to claim 1, wherein the selected frequency is in a range between 0 Hz and 2 kHz.

9. The method according to claim 1, wherein detecting the operation status of the electric motor on the basis of the spectrum analysis comprises:
comparing the analyzed spectrum with a normal spectrum, so as to detect an abnormal behavior of the electric motor.

10. The method according to claim 1, comprising:
displaying a status of the operation status of the electric motor.

11. The method according to claim 1, wherein the drive application signals are discarded.

12. The method according to claim 1, wherein a plurality of frequencies are analyzed simultaneously.

13. The method according to claim 1, wherein the operation status of the electric motor includes vibration or electrical resonance.

14. The method according to claim 1, wherein when an abnormal operation status is detected, the method further comprises warning a user of the issue.

15. The method according to claim 1, wherein when an abnormal operation status is detected, the method further comprises providing recommendations, causing modification of parameters of the electric motor and/or causing the electric motor to shut down.

16. A computer program product comprising a non-transitory computer-readable medium having stored thereon instructions to be executed by a processor, the instructions being adapted to cause performance of the method according to claim 1 when executed by the processor.

17. A system for monitoring operation status of an electric motor in real time, comprising:
- at least one sensor for generating drive application signal of the electric motor; and
- a digital signal processor, configured to execute the instructions stored on the non-transitory computer-readable medium of the computer program product according to claim 16 based on the generated drive application signal.

\* \* \* \* \*